United States Patent
Sadoughi et al.

(10) Patent No.: US 6,841,491 B1
(45) Date of Patent: Jan. 11, 2005

(54) IN SITU DEPOSITION OF A NITRIDE LAYER AND OF AN ANTI-REFLECTIVE LAYER

(75) Inventors: Sharmin Sadoughi, Cupertino, CA (US); Krishnaswamy Ramkumar, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 35 days.

(21) Appl. No.: 10/039,469

(22) Filed: Nov. 8, 2001

(51) Int. Cl.[7] ................................. H01L 21/31
(52) U.S. Cl. ................................................ 438/778
(58) Field of Search ........................... 438/636, 769, 438/778, 791

(56) References Cited

U.S. PATENT DOCUMENTS

| | | | | |
|---|---|---|---|---|
| 5,639,687 A | * | 6/1997 | Roman et al. | 438/69 |
| 6,130,146 A | * | 10/2000 | Chang et al. | 438/592 |
| 6,174,590 B1 | * | 1/2001 | Iyer et al. | 428/209 |
| 6,174,644 B1 | * | 1/2001 | Shieh et al. | 430/272.1 |
| 6,235,456 B1 | * | 5/2001 | Obok | 430/512 |
| 6,423,631 B1 | * | 7/2002 | Iyer et al. | 438/636 |
| 6,436,812 B1 | * | 8/2002 | Lee | 438/636 |
| 2001/0012667 A1 | * | 8/2001 | Ma et al. | 438/287 |

\* cited by examiner

*Primary Examiner*—David Nelms
*Assistant Examiner*—Thao P. Le
(74) *Attorney, Agent, or Firm*—Evan Law Group LLC

(57) ABSTRACT

A process for fabricating a semiconductor structure comprises depositing a nitride layer on a semiconductor substrate with a first tool, and depositing an anti-reflective layer on the semiconductor substrate with the first tool. The nitride layer includes silicon and nitrogen.

35 Claims, 3 Drawing Sheets

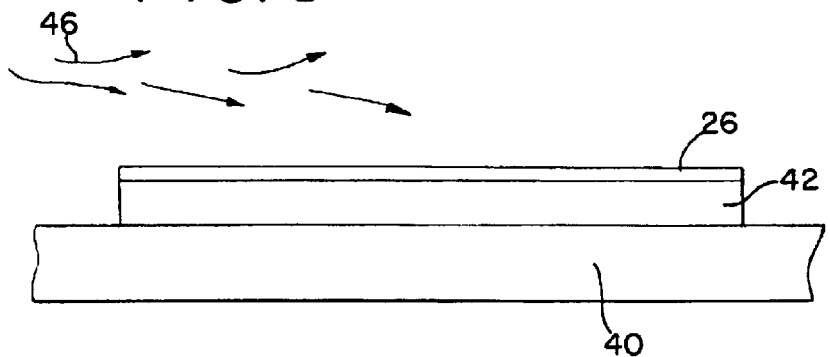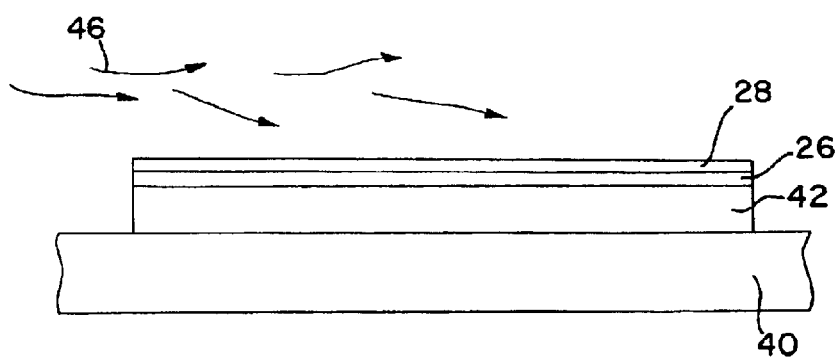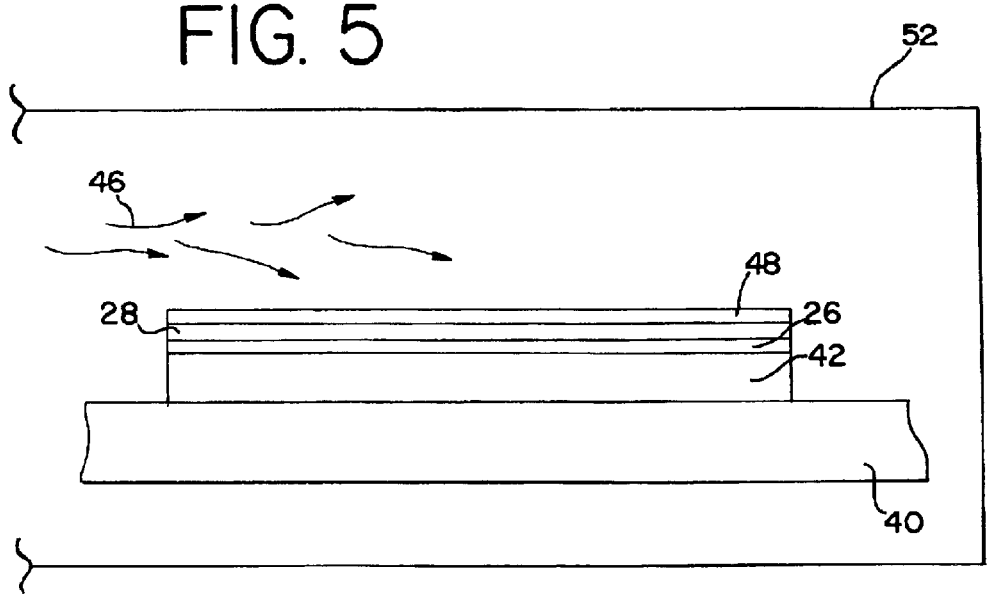

IN SITU DEPOSITION OF A NITRIDE LAYER AND OF AN ANTI-REFLECTIVE LAYER

BACKGROUND

This invention relates generally to semiconductor devices. In particular, the present invention relates to a method and process for manufacturing a semiconductor structure or a semiconductor device.

The manufacturing of some semiconductor structures requires forming a silicon nitride layer on a semiconductor substrate and then patterning the silicon nitride layer. When using sub-micron photolithography to pattern a silicon nitride layer, an anti-reflective coating (ARC) is often used to minimize the effects of reflection from the silicon nitride layer.

One approach for patterning a silicon nitride layer requires the deposition of silicon nitride in a low-pressure chemical vapor deposition (LPCVD) chamber followed by the spin-coating of an organic ARC onto the semiconductor substrate. However, as device geometries shrink, organic ARC's may run into problems when trying to obtain optimum photolithography performance. Also, the spin-coating of an organic ARC tends to result in an uneven deposition of the organic ARC, which forms puddles in recessed regions in the underlying silicon nitride layer. As a result of the puddles, the thickness of the organic ARC in these regions is so high that the organic ARC cannot be completely etched off during later processing, thus leaving a residual amount of the organic ARC. The residual organic ARC acts as a mask and prevents the etching of portions of the underlying silicon nitride layer nitride. Stringers of unetched silicon nitride can result. These stringers increase the chances of device failure.

A second approach for patterning a silicon nitride layer requires the use of an inorganic ARC (IARC) made of silicon oxy-nitride or silicon-rich silicon nitride instead of an organic ARC. An IARC yields better photolithography performance and is free from the stringer problem, because the IARC is more evenly deposited on the semiconductor substrate. Currently, the IARC is commonly deposited using plasma-enhanced chemical vapor deposition (PECVD). However, IARC also has certain disadvantages: first, the deposition of the IARC requires an additional deposition step in a PECVD chamber; second, the placement of the IARC layer is limited to either the bottom or the top of the silicon nitride layer; and third, to prevent poisoning of a photoresist layer within the semiconductor device, the IARC layer needs to be capped by an oxide layer usually having a thickness of less than 100 Angstroms. Furthermore, because of the high deposition rate, the oxide layer is difficult to deposit in a controlled way in a PECVD chamber.

BRIEF SUMMARY

According to a first aspect of the present invention, a process for fabricating a semiconductor structure is provided. The process includes depositing a nitride layer on a semiconductor substrate with a first tool. The nitride layer includes silicon and nitrogen. The process further includes depositing an anti-reflective layer on the semiconductor substrate with the first tool. Preferably, the depositing of the nitride layer occurs before the depositing of the anti-reflective layer. In one embodiment, the depositing of the anti-reflective layer occurs before the depositing of the nitride layer.

According to another aspect of the present invention, a process for fabricating a semiconductor structure is provided. The process includes depositing a nitride layer on a semiconductor substrate in a sealed chamber. The nitride layer comprises silicon and nitrogen. The process also includes depositing an anti-reflective layer on the semiconductor substrate in the sealed chamber, wherein the depositing of the nitride layer and the depositing of the anti-reflective layer are both performed without opening the sealed chamber.

BRIEF DESCRIPTION OF THE DRAWINGS

FIGS. 3–5 illustrate, in cross-section, process steps for the fabrication of a semiconductor structure, in accordance with one preferred embodiment of the invention.

Figure 1:
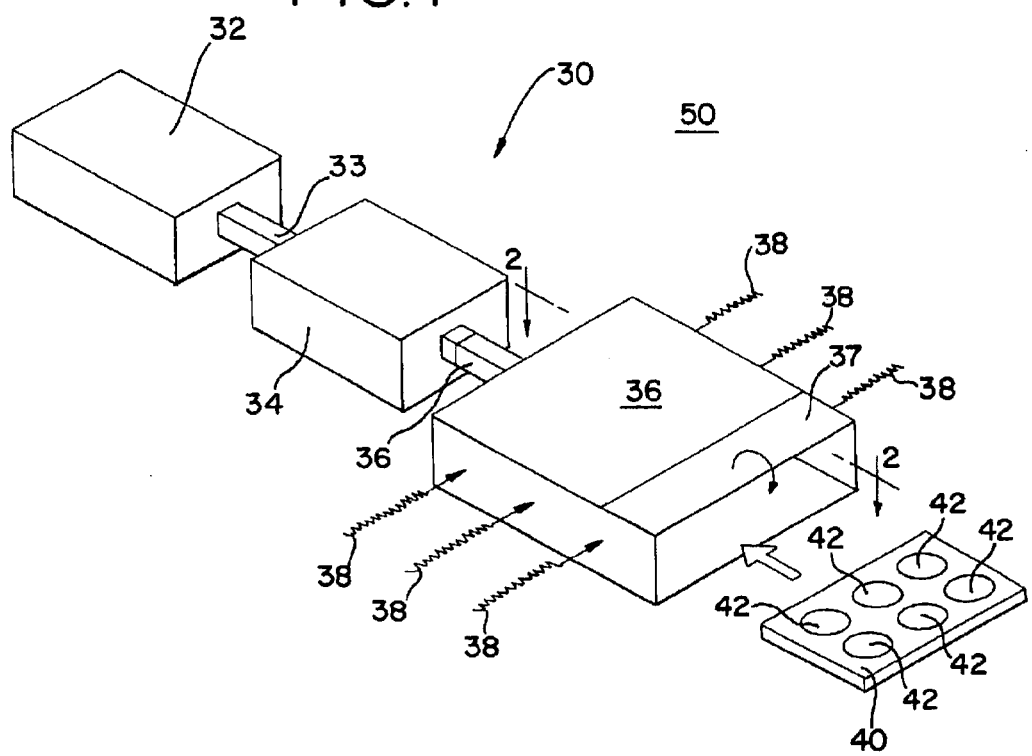
FIG. 1 is a perspective view of a chemical vapor deposition (CVD) system used to fabricate a semiconductor device, in accordance with one embodiment.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION

Shown in FIG. 1 is a first tool 30 suitable for use in fabricating a semiconductor structure having a semiconductor substrate 42. The first tool 30 comprises a chemical vapor deposition (CVD) tool, such as, for example, a single wafer CVD tool, an atmospheric pressure CVD tool, a low pressure CVD (LPCVD) tool, or a plasma-enhanced CVD (PECVD) tool. Chemical vapor deposition tools are well know by those skilled in the art and are also described in the book "MicroChip Fabrication," Peter Van Zant, Third Edition, Chapter Twelve, pp. 351–389. In one preferred embodiment, the first tool 30 comprises a LPCVD tool. In another embodiment, the first tool 30 comprises a PECVD tool. An example of a suitable PECVD tool is the AMAT P 5000, manufactured by Applied Materials, Santa Clara, Calif.

First tool 30 includes a chemical source section 32, a flow control and timer section 34, a reaction chamber 36, and tubing 33, 35 connecting the chemical source section 32 to the flow control and timer section 34 and connecting the flow control and timer section 34 to the reaction chamber 36. The chemical source section 32 houses chemicals 46 that are used to fabricate the semiconductor structure, as illustrated in FIGS. 3–6. Chemical source section 32 is connected to the flow control and timer section 34 through tubing 33. The flow control and timer section 34 controls the amount of chemicals 46 that are allowed to enter the reaction chamber 36. Typically, the flow control and timer section 34 controls the amount of chemicals 46 entering the reaction chamber 36 by controlling the volumetric flow rate of the chemicals 46. The flow control and timer section 34 is connected to the reaction chamber 36 through tubing 35. The reaction chamber 36 houses the semiconductor substrate 42. In one embodiment, at least a plurality of semiconductor substrates 36 are mounted on a wafer holder 40, as illustrated in FIGS.

1–2, in order to increase the amount of semiconductor structures fabricated. The wafer holder 40 is then placed in the reaction chamber 36 and the reaction chamber 36 is sealed. Preferably, the reaction chamber 36 includes a door 37 which can be opened to let the semiconductor substrate 42 in and out of the reaction chamber 36 and which can be closed to seal the reaction chamber 36 from the surrounding atmosphere 50, as illustrated in FIGS. 1–2.

Figure 2:
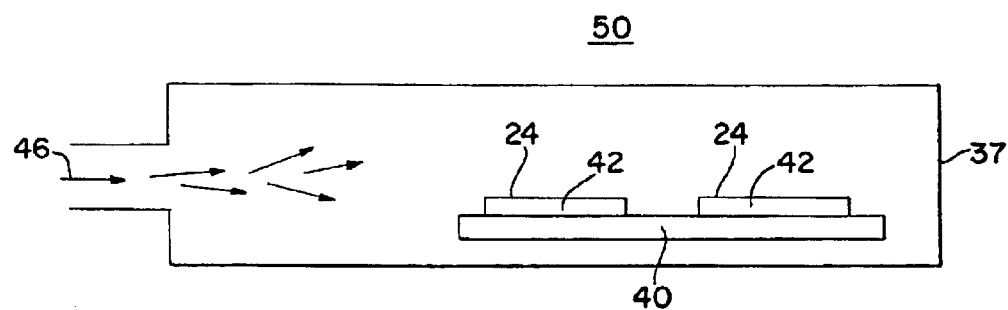
FIG. 2 is a cross-sectional view of the CVD system of FIG. 1 enclosing a plurality of semiconductor substrates, in accordance with one embodiment.

Referring to FIG. 2, the semiconductor structure of the present invention includes a semiconductor substrate 42. Preferably, the semiconductor substrate 42 comprises a single crystal silicon substrate, however, semiconductor substrate 42 may comprise other materials. Suitable materials for semiconductor substrate 42 include but are not limited to silicon, gallium arsenide, germanium, gallium nitride, aluminum phosphide, $Si_{1-x}Ge_x$ and $Al_xGa_{1-x}As$ alloys, wherein x is greater than or equal to zero and less than or equal to one, the like, and combinations thereof. Additional examples of materials for semiconductor substrate 42 in accordance with the present invention are set forth in *Semiconductor Device Fundamentals* by Robert F. Pierret (p. 4, Table 1.1, Addison-Wesley, 1996). Preferably, semiconductor substrate 42 has a principal surface 24 previously processed and cleaned to remove debris and native oxides. The semiconductor substrate 42 may be formed into a wafer-like shape and then a plurality of semiconductor substrates 42 may be placed on a wafer holder 40, as illustrated in FIGS. 1–2.

After forming the semiconductor substrate 42, semiconductor substrate 42 is then placed in the first tool 30, and more particularly, placed in the reaction chamber 36 of the first tool 30, as illustrated in FIGS. 1–2. Once the semiconductor substrate 42 is placed in the reaction chamber 36 of the first tool 30, the reaction chamber 36 is sealed so as to prevent the surrounding atmosphere 50 from entering the reaction chamber 36.

After sealing the reaction chamber 36, a nitride layer 26 is deposited on the semiconductor substrate 42 with the first tool 30, as illustrated in FIG. 3. The nitride layer 26 comprises silicon and nitrogen. Preferably, the nitride layer 26 comprises silicon nitride. The nitride layer 26 is deposited by reacting a mixture of chemicals 46 in the reaction chamber 36 at a particular temperature and pressure range. Preferably, the mixture of chemicals 46 comprises $SiH_2Cl_2$ and $NH_3$. In one embodiment, the nitride layer 26 is deposited by reacting $SiH_2Cl_2$ and $NH_3$ in the reaction chamber 36 at a temperature of 750° C. to 800° C. and at a pressure of 150 mTorr to 250 mTorr, where the first tool 30 comprises an LPCVD tool. In one embodiment, the nitride layer 26 is deposited by reacting $SiH_2Cl_2$ and $NH_3$ in the reaction chamber 36 at a temperature of 700° C. to 750° C. and at a pressure of 1 Torr to 5 Torr, wherein the first tool 30 comprises a CVD tool.

By varying the ratio of chemicals 46, the stoichiometry of the nitride layer 26 may be changed. For example, if the chemicals 46 comprise $SiH_2Cl_2$ and $NH_3$ and the volumetric flow rate ratio for $SiH_2Cl_2:NH_3$ is 0.3:1 to 5:1, the nitride layer 26 could comprises either a silicon deficient nitride or a silicon rich nitride. Moreover, by varying the volumetric flow rate ratio for $SiH_2Cl_2:NH_3$, the nitride layer 26 could comprise a graded silicon nitride layer, wherein the stoichiometry of the nitride layer 26 varies in a direction along the thickness of the nitride layer 26.

An anti-reflective layer 28 is deposited on the semiconductor substrate 42 with the first tool 30, as illustrated in FIG. 4. Preferably, the anti-reflective layer 28 comprises an inorganic anti-reflective layer such as silicon oxynitride. The anti-reflective layer 28 is deposited by reacting a mixture of chemicals 46 in the reaction chamber 36 at a particular temperature and pressure range. Preferably, the mixture of chemicals 46 comprises $SiH_2Cl_2$, $NH_3$, and $N_2O$. In one embodiment, the anti-reflective layer 28 is deposited by reacting the $SiH_2Cl_2$, the $NH_3$, and the $N_2O$ in the reaction chamber 36 at a temperature of 750° C. to 800° C. and at a pressure of 150 mTorr to 250 mTorr, wherein the first tool 30 comprises an LPCVD tool. In one embodiment, the anti-reflective layer 28 is deposited by reacting the $SiH_2Cl_2$, the $NH_3$, and the $N_2O$ in the reaction chamber 36 at a temperature of 700° C. to 750° C. and at a pressure of 1 Torr to 5 Torr, wherein the first tool 30 comprises a CVD tool.

Figure 6:
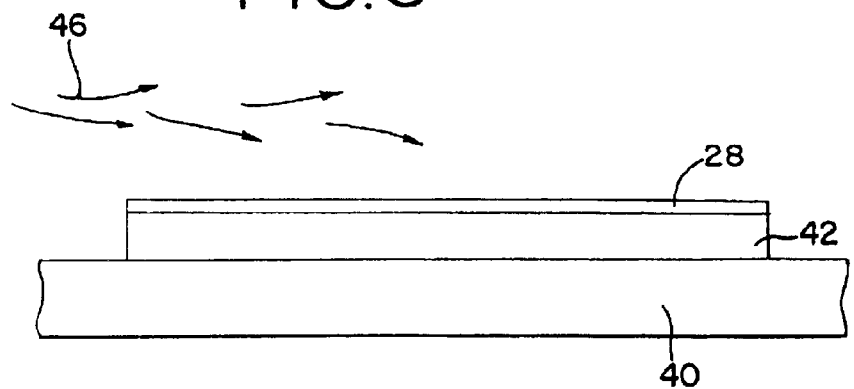
FIGS. 6–8 illustrate, in cross-section, process steps for the fabrication of a semiconductor structure, in accordance with one preferred embodiment of the invention.
Figure 7:
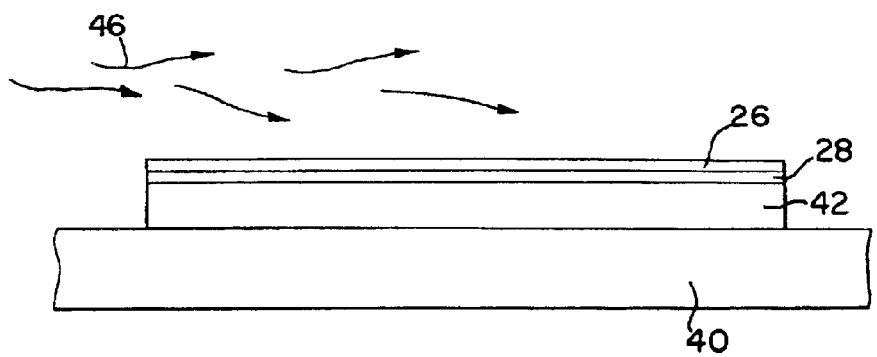
Figure 8:
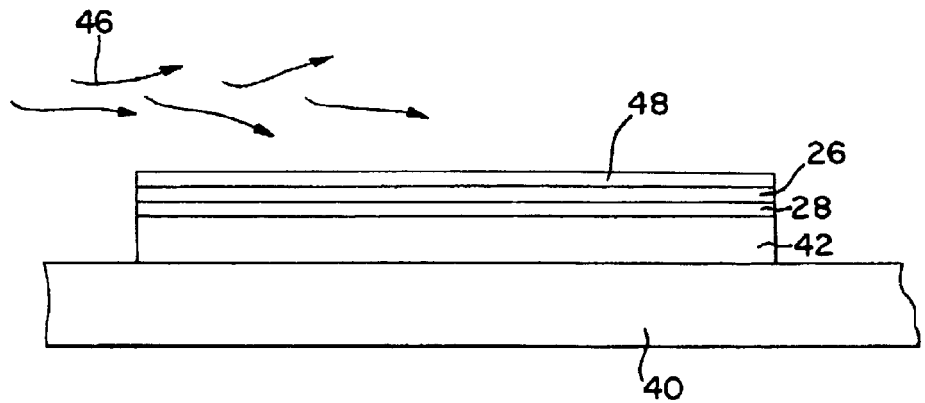

By varying the ratio chemicals 36, the stoichiometry of the anti-reflective layer 28 may be changed. Preferably, if the chemicals 46 comprise $SiH_2Cl_2$, $NH_3$, and $N_2O$, the volumetric flow rate ratio for $SiH_2Cl_2:NH_3:N_2O$ is. in the range of 0.3:1:0.3 to 5:1:3. In one embodiment, the nitride layer 26 is deposited on the semiconductor substrate 42 before the anti-reflective layer 28 is deposited on the semiconductor substrate, as illustrated in FIGS. 3–5. In another embodiment, the anti-reflective layer 28 is deposited on the semiconductor substrate 42 before the nitride layer 26 is deposited on the semiconductor substrate, as illustrated in FIGS. 6–8. Both the nitride layer 26 and the anti-reflective layer 28 are deposited using a single tool, that is, first tool 30. By depositing both the nitride layer 26 and the anti-reflective layer 28 using the same tool, the amount of time and the number of steps required for fabricating a semiconductor structure can be reduced, thus reducing the cost of producing a semiconductor device. In another embodiment, the reaction chamber 36 is sealed and the nitride layer 26 and the anti-reflective layer 28 are both deposited in the sealed reaction chamber 36 without opening the sealed reaction chamber 36.

By using the above described method, the nitride layer 26 can be deposited on the anti-reflective layer 28, the anti-reflective layer 28 can be deposited on the nitride layer, the nitride layer 26 can be sandwiched between two anti-reflective layers 28, or the anti-reflective layer 28 can be sandwiched between two nitride layers.

In one preferred embodiment, after depositing the anti-reflective layer 28 and the nitride layer 26, an oxide layer 48 is deposited on the semiconductor substrate 42 with a second tool 52, as illustrated in FIG. 5. The second tool 52 comprises a chemical vapor deposition (CVD) tool, such as, for example, a single wafer CVD tool, an atmospheric pressure CVD tool, a low pressure CVD (LPCVD) tool, or a plasma-enhanced CVD (PECVD) tool. Preferably, the second tool 52 is the same as the first tool 30. The oxide layer 48 comprises an oxide, such as $SiO_2$. The oxide layer 48 is deposited by reacting a mixture of chemicals 46 in the reaction chamber 36 at a particular temperature and pressure range. Preferably, the mixture of chemicals 46 comprises $SiH_2Cl_2$ and $N_2O$. In one embodiment, the oxide layer 48 is deposited by reacting the $SiH_2Cl_2$ and the $N_2O$ in the reaction chamber 36 at a temperature of 750° C. to 800° C. and at a pressure of 150 mTorr to 250 mTorr, wherein the first tool 30 comprises an LPCVD tool. In another embodiment, the oxide layer 48 is deposited by reacting the $SiH_2Cl_2$ and the $N_2O$ in the reaction chamber 36 at a temperature of 700° C. to 750° C. and at a pressure of 1 Torr to 5 Torr, wherein the first tool 30 comprises a CVD tool. By depositing an oxide layer 48 on the semiconductor substrate 42 after depositing the anti-reflective layer 28 and the nitride layer 26, the oxide layer 48 is able to act as a seal or a cap on the anti-reflective layer 28 and the nitride layer 26 so as to prevent poising of the anti-reflective layer 28 and the nitride layer 26. Preferably, the oxide layer 48 has an initial thickness of between 50 to 150 angstroms.

The individual semiconductor processing steps used in accordance with the present invention (e.g., CVD, etc.) are well known to those of ordinary skill in the art, and are also described in numerous publications and treatises, including: *Encyclopedia of Chemical Technology, Volume* 14 (Kirk-Othmer, 1995, pp. 677–709); *Semiconductor Device Fundamentals* by Robert F. Pierret (Addison-Wesley, 1996); *Silicon Processing for the VLSI Era* by Wolf (Lattice Press, 1986, 1990, 1995, vols 1–3, respectively); and *Microchip Fabrication: A Practical Guide to Semiconductor Processing* by Peter Van Zant (4$^{th}$ Edition, McGraw-Hill, 2000).

A semiconductor structure produced in accordance with and embodying features of the present invention can undergo additional processing in order to produce semiconductor devices and electronic devices incorporating such semiconductor devices. For example, source/drain regions, gates, gate dielectric layers, and the like can be formed on the semiconductor substrate 42 to make transistors, which may be connected together through dielectric layers by contacts and metallization layers. Such additional elements may be formed before, during, or after formation of the nitride layer 26 and the antireflective layer 28.

Semiconductor structures embodying features of and produced in accordance with the present invention may be incorporated into a great variety of semiconductor devices, including but not limited to: integrated circuits (e.g., memory cells such as SRAM, DRAM, EPROM, EEPROM, and the like); programmable logic devices; data communications devices; clock generation devices; and so forth. Furthermore, any of these semiconductor devices may itself be incorporated into a multitude of electronic devices, including but not limited to computers, automobiles, airplanes, satellites, and the like.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention.

What is claimed is:

1. A process for fabricating a semiconductor structure, comprising:
   depositing a nitride layer on a semiconductor substrate with a first tool, wherein the nitride layer comprises silicon and nitrogen;
   depositing an anti-reflective layer on the semiconductor substrate with the first tool; and
   depositing an oxide layer on the semiconductor substrate with a second tool, wherein the first tool and the second tool are the same;
   wherein the depositing of the anti-reflective layer comprises reacting $SiH_2Cl_2$, $NH_3$, and $N_2O$.

2. The process of claim 1, wherein the depositing of the nitride layer occurs before the depositing of the anti-reflective layer.

3. The process of claim 1, wherein the depositing of the anti-reflective layer occurs before the depositing of the nitride layer.

4. The process of claim 1, wherein the depositing of the nitride layer comprises reacting $SiH_2Cl_2$ and $NH_3$.

5. The process of claim 4, wherein the volumetric flow rate ratio for $SiH_2Cl_2$:$NH_3$ is from 0.3:1 to 5:1.

6. The process of claim 1, wherein the nitride layer comprises silicon deficient nitride.

7. The process of claim 1, wherein the nitride layer comprises silicon rich nitride.

8. The process of claim 1, wherein the nitride layer comprises a graded silicon nitride layer.

9. The process of claim 1, wherein the anti-reflective layer comprises silicon oxynitride.

10. The process of claim 1, wherein the depositing of the oxide layer comprises reacting $SiH_2Cl_2$ and $N_2O$.

11. The process of claim 1, wherein the first tool comprises a low-pressure chemical vapor deposition tool or a plasma-enhanced chemical vapor deposition tool.

12. A process for fabricating a semiconductor device, comprising:
    forming a semiconductor structure by the process of claim 1; and
    forming a semiconductor device from the semiconductor structure.

13. A process for making an electronic device comprising:
    forming a semiconductor device by the process of claim 12; and
    forming the electronic device comprising the semiconductor device.

14. A process for fabricating a semiconductor structure, comprising:
    depositing a nitride layer on a semiconductor substrate with a first tool, wherein the nitride layer comprises silicon and nitrogen;
    depositing an anti-reflective layer on the semiconductor substrate with the first tool; and
    depositing an oxide layer on the semiconductor substrate with the first tool;
    wherein the anti-reflective layer comprises silicon-rich nitride.

15. The process of claim 14, wherein the depositing of the nitride layer comprises reacting $SiH_2Cl_2$ and $NH_3$.

16. The process of claim 15, wherein the volumetric flow rate ratio for $SiH_2Cl_2$:$NH_3$ is from 0.3:1 to 5:1.

17. The process of claim 14, wherein the nitride layer comprises silicon deficient nitride.

18. The process of claim 14,
    wherein the depositing of the oxide layer comprises reacting $SiH_2Cl_2$ and $N_2O$.

19. A process for fabricating a semiconductor device, comprising:
    forming a semiconductor structure by the process of claim 14; and
    forming a semiconductor device from the semiconductor structure.

20. A process for making an electronic device comprising:
    forming a semiconductor device by the process of claim 19; and
    forming the electronic device comprising the semiconductor device.

21. A process for fabricating a semiconductor structure, comprising:
    depositing a nitride layer on a semiconductor substrate with a first tool, wherein the nitride layer comprises silicon and nitrogen; and
    depositing an anti-reflective layer on the semiconductor substrate with the first tool;
    wherein the depositing of the anti-reflective layer comprises reacting $SiH_2Cl_2$, $NH_3$, and $N_2O$, the depositing of the nitride layer comprises reacting $SiH_2Cl_2$ and $NH_3$, and the volumetric flow rate ratio for $SiH_2Cl_2$:$NH_3$ is from 0.3:1 to 5:1.

22. A process for fabricating a semiconductor structure, comprising:

depositing a nitride layer on a semiconductor substrate with a first tool, wherein the nitride layer comprises silicon and nitrogen; and depositing an anti-reflective layer on the semiconductor substrate with the first tool;

wherein the depositing of the anti-reflective layer comprises reacting $SiH_2Cl_2$, $NH_3$, and $N_2O$, and the nitride layer comprises silicon deficient nitride.

23. The process of claim 22, wherein the depositing of the nitride layer comprises reacting $SiH_2Cl_2$ and $NH_3$, and the volumetric flow rate ratio for $SiH_2Cl_2$:$NH_3$ is from 0.3:1 to 5:1.

24. The process of claim 22, further comprising depositing an oxide layer on the semiconductor substrate with a second tool, wherein the first tool and the second tool are the same.

25. A process for making an electronic device, comprising:

forming a semiconductor structure by the process of claim 22;

forming a semiconductor device from the semiconductor structure; and forming the electronic device comprising the semiconductor device.

26. A process for fabricating a semiconductor structure, comprising:

depositing a nitride layer on a semiconductor substrate with a first tool, wherein the nitride layer comprises silicon and nitrogen; and depositing an anti-reflective layer on the semiconductor substrate with the first tool;

wherein the depositing of the anti-reflective layer comprises reacting $SiH_2Cl_2$, $NH_3$, and $N_2O$, and the nitride layer comprises silicon rich nitride.

27. The process of claim 26, wherein the depositing of the nitride layer comprises reacting $SiH_2Cl_2$ and $NH_3$, and the volumetric flow rate ratio for $SiH_2Cl_2$:$NH_3$ is from 0.3:1 to 5:1.

28. The process of claim 26, further comprising depositing an oxide layer on the semiconductor substrate with a second tool, wherein the first tool and the second tool are the same.

29. A process for making an electronic device, comprising:

forming a semiconductor structure by the process of claim 26;

forming a semiconductor device from the semiconductor structure; and forming the electronic device comprising the semiconductor device.

30. A process for fabricating a semiconductor structure, comprising:

depositing a nitride layer on a semiconductor substrate with a first tool, wherein the nitride layer comprises silicon and nitrogen; and depositing an anti-reflective layer on the semiconductor substrate with the first tool;

wherein the depositing of the anti-reflective layer comprises reacting $SiH_2Cl_2$, $NH_3$, and $N_2O$, and the nitride layer comprises a graded silicon nitride layer.

31. The process of claim 30, wherein the depositing of the nitride layer comprises reacting $SiH_2Cl_2$ and $NH_3$, and the volumetric flow rate ratio for $SiH_2Cl_2$:$NH_3$ is from 0.3:1 to 5:1.

32. The process of claim 30, further comprising depositing an oxide layer on the semiconductor substrate with a second tool, wherein the first tool and the second tool are the same.

33. A process for making an electronic device, comprising:

forming a semiconductor structure by the process of claim 30;

forming a semiconductor device from the semiconductor structure; and forming the electronic device comprising the semiconductor device.

34. A process for fabricating a semiconductor structure, comprising:

depositing a nitride layer on a semiconductor substrate with a first tool, wherein the nitride layer comprises silicon and nitrogen; and depositing an anti-reflective layer on the semiconductor substrate with the first tool;

wherein the anti-reflective layer comprises silicon-rich nitride, the depositing of the nitride layer comprises reacting $SiH_2Cl_2$ and $NH_3$, and the volumetric flow rate ratio for $SiH_2Cl_2$:$NH_3$ is from 0.3:1 to 5:1.

35. A process for fabricating a semiconductor structure, comprising:

depositing a nitride layer on a semiconductor substrate with a first tool, wherein the nitride layer comprises silicon and nitrogen; and depositing an anti-reflective layer on the semiconductor substrate with the first tool;

wherein the anti-reflective layer comprises silicon-rich nitride, and the nitride layer comprises silicon deficient nitride.

* * * * *